Figure 1:
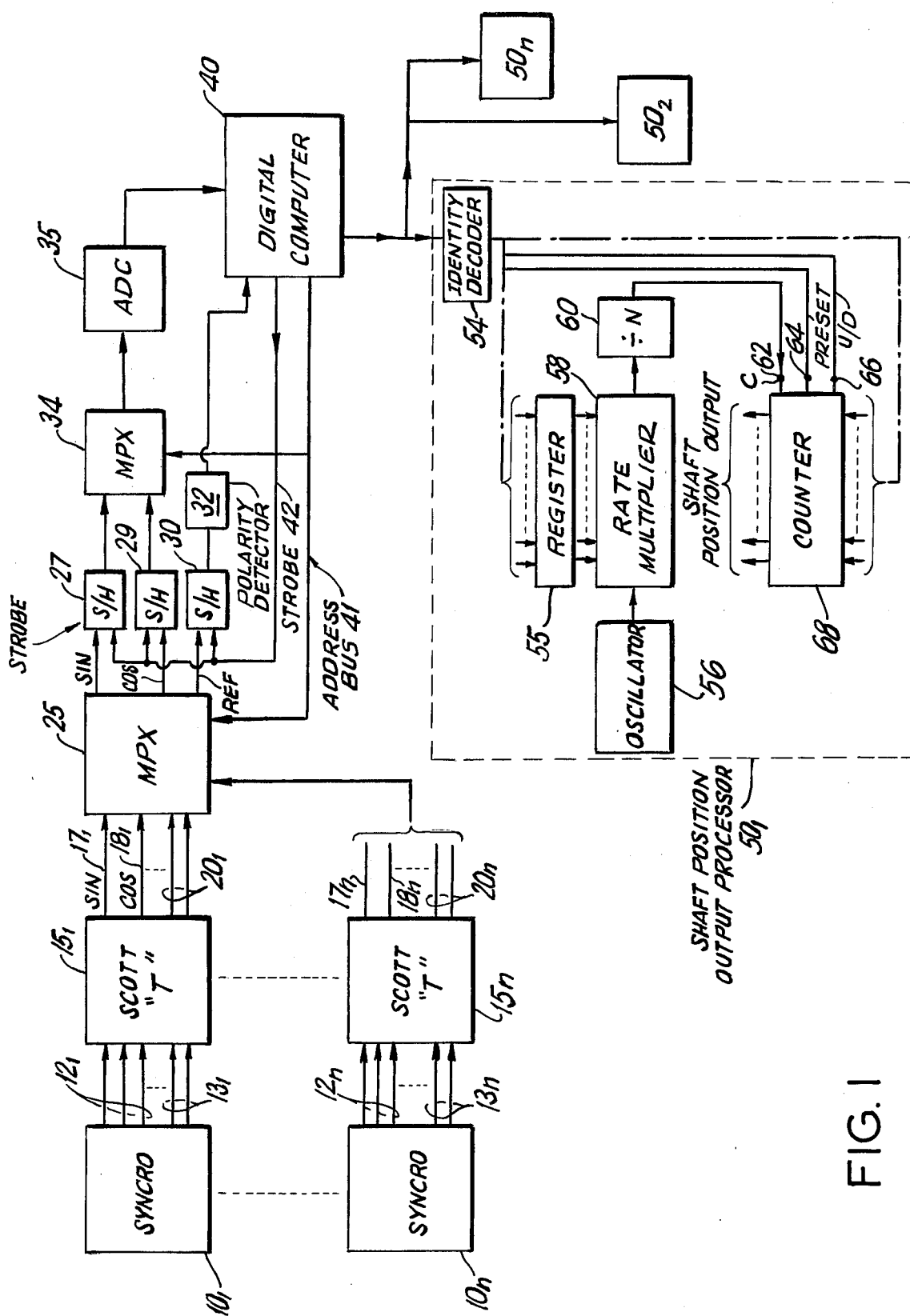

United States Patent [19]

Freed et al.

[11] 4,062,005

[45] Dec. 6, 1977

[54] SYNCHRO-TO-DIGITAL CONVERTER EMPLOYING COMMON PROCESSING APPARATUS

[75] Inventors: Gerald Lewis Freed, Highland Park; David S. Lerner, Fanwood, both of N.J.

[73] Assignee: Lockheed Electronics Co., Inc., Plainfield, N.J.

[21] Appl. No.: 628,471

[22] Filed: Nov. 4, 1975

[51] Int. Cl.² .............................................. G08C 19/38
[52] U.S. Cl. .............................. 340/198; 340/177 R; 340/347 SY
[58] Field of Search ................. 340/198, 347 SY, 204, 340/195, 177 R; 318/186, 175

[56] References Cited

U.S. PATENT DOCUMENTS

| 2,991,462 | 7/1961 | Hose | 340/198 |
|---|---|---|---|
| 3,023,959 | 3/1962 | Rabin et al. | 340/198 |
| 3,273,136 | 9/1966 | Steer | 340/198 |
| 3,440,644 | 4/1969 | Burgis et al. | 340/198 |
| 3,618,073 | 11/1971 | Domchick et al. | 340/347 SY |
| 3,670,324 | 6/1972 | Trevor | 340/347SY |
| 3,831,170 | 8/1974 | Christensen | 340/347 SY |
| 3,895,365 | 7/1975 | Freed | 340/198 |
| 3,984,831 | 10/1976 | Jones et al. | 340/347 SY |

Primary Examiner—John W. Caldwell, Sr.
Assistant Examiner—James J. Groody

[57] ABSTRACT

Circuitry monitors a plurality of rotating shafts, and provides a corresponding plurality of binary output words each characterizing the angular position of an associated shaft. Synchro and Scott "T" per-shaft monitoring elements are sampled by common multiplexer-central processor units which provide derived shaft position and shaft rate information to an appropriate one of plural shaft position output processors.

In accordance with varying aspects of the present invention, the output processors include a rate multiplier controlled by the computer generated shaft rate signal, and a counter presetable by the CPU generated position signal, and advanced (decremented) by the rate multiplier output.

12 Claims, 2 Drawing Figures

SYNCHRO-TO-DIGITAL CONVERTER EMPLOYING COMMON PROCESSING APPARATUS

DISCLOSURE OF INVENTION

This invention relates to electronic shaft position encoders and, more specifically, to such an encoder for providing an array of output digital words which track the angular positions of a corresponding array of rotating shafts.

It is an object of the present invention to provide improved shaft position converter apparatus.

More specifically, it is an object of the present invention to provide improved electronic shaft position encoding apparatus, employing time shared common circuitry, for developing plural digital output words each reporting on the angular disposition of a monitored rotatable shaft.

It is another object of the present invention to provide sampled shaft encoder apparatus which progressively increments the reported shaft angle between sampling intervals based upon rotational rate history projections.

The above and other objects of the present invention are realized in specific illustrative shaft position encoding apparatus for providing plural output digital words each characterizing the angular position of an associated shaft. Shaft status is monitored by plural synchro-Scott "T" elements, and a multiplexer employed to serially connect signals indicative of the several shaft angles to a central processing unit (CPU).

Rate multipliers are employed in one-to-one correspondence with the monitored shafts, and are controlled by the CPU based upon shaft position information determined by the appropriate synchro, and also upon the computer derived shaft rate. Each rate multiplier output then cycles an associated counter which provides the requisite binary word characterizing shaft position.

Figure 2:
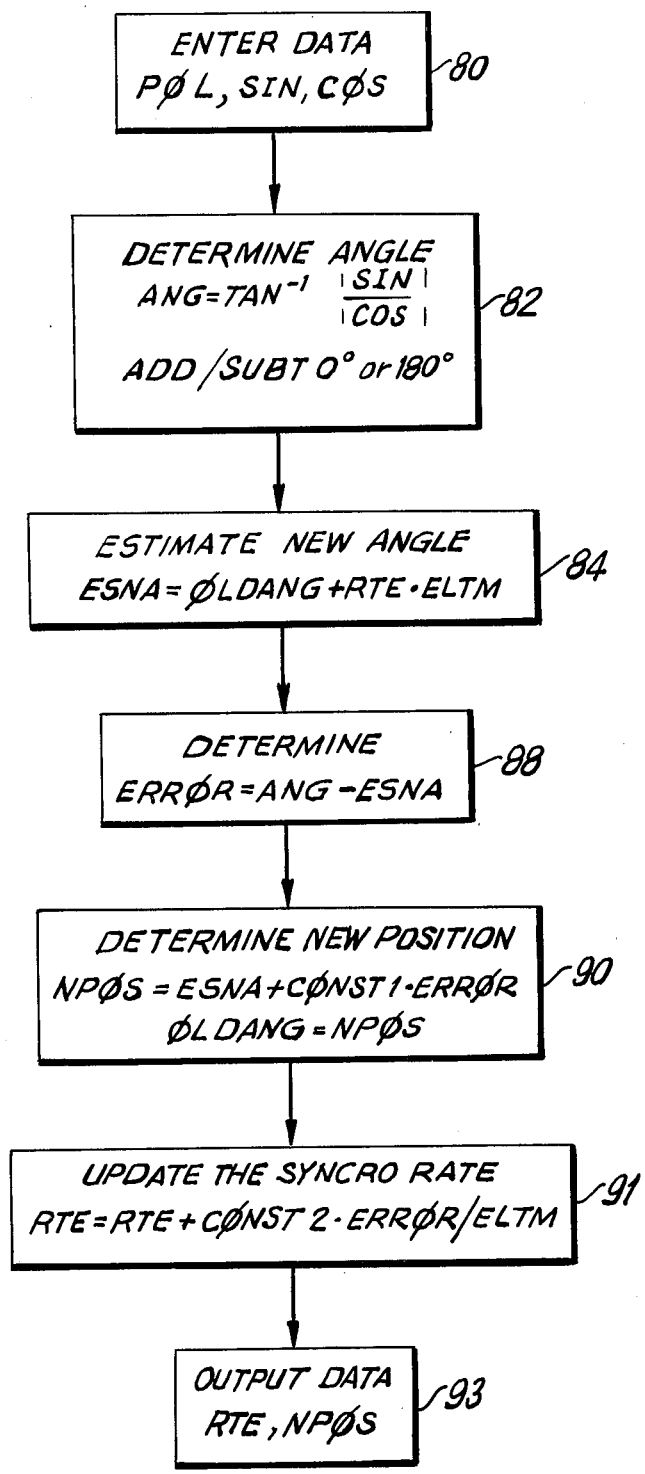

The above and other features and advantages of the present invention will become more clear from a detailed discussion of a particular synchro-to-shaft position encoder, presented hereinbelow in conjunction with the accompanying drawing, in which:

FIG. 1 is a block diagram of multiple shaft position encoding apparatus embodying the principles of the present invention; and FIG. 2 is a flow chart depicting operation of a digital processor 40 of FIG. 1.

Referring now to FIG. 1, the shaft encoder there shown includes a plurality of synchros 10 each mechanically coupled to an associated monitored shaft. Each synchro provides an output reference wave on leads $13_i$ emanating therefrom, and also three waves at the reference wave frequency, the amplitudes of the three waves differing by 120 electrical degrees on leads $12_i$ to characterize the angular position of the monitored shaft. Each synchro $10_i$ output $12_i$, $13_i$ is coupled to a Scott-"T" $15_i$ which provides the reference wave at output $20_i$. The Scott "T" $15_i$ also develops at output leads $17_i$ and $18_i$ signals of the reference frequency but having amplitude proportional to the cosine and sine of the shaft angle. The sine and cosine function waves are of the same polarity as the reference wave for shaft displacement angles in the first and second, and first and fourth quadrants, respectively, and opposite in polarity for shaft rotations through the other quadrants. Operation for the synchros 10 and Scott "T"s 15 is well known per se. Also, multiple geared synchros (coarse and fine shaft angle resolution) may be employed, if desired.

A multiplexer 25, operative under control of a digital computer 40 via an address bus 41, serially connects the sine (lead $17_i$) cosine (lead $15_i$) and reference (leads $20_i$) outputs of the Scott "T"s $15_i$ to sample and hold circuits 27, 29 and 30, respectively. The sample/hold circuits 27, 29 and 30 are strobed by the CPU 40 to thus store an analog measure at the common sampling strobe instant of the sine, cosine and reference waves of the shaft position characterizing the Scott "T" 15 outputs. For each Scott "T" 15 polling cycle, the analog sine and cosine wave values are sequentially passed by a multiplexer 34 for conversion to digital form by an analog-to-digital converter 35, and thence as inputs to the digital computer 40.

The reference output from the sample and hold circuit 30 passes to a polarity detector 32 which signals the results of such polarity determination to the CPU 40.

The computer 40 responds to each new set of shaft position data by (1) determining the present shaft position (in a manner not unduly subject to one set of bad data such as possibly caused by an electrical transient), and (2) updating the CPU's estimate of the instantaneous rate of rotation of the monitored shaft (so that the composite multiple shaft encoder of the instant invention can update shaft position between sampling periods for each shaft). Basically, the shaft position being reported by the incoming data is established by determining the arc tangent of the sine and cosine Scott "T" values from sample/hold circuits 27, 29 and then determining the appropriate quadrant depending upon the relative polarity of the sine, cosine and reference signals supplied to the computer. This reported "new angle" is then used by the computer to determine the actual shaft position. Computational "inertia" is employed — and the reported angle is not used per se, to avoid simply adopting what may be bad data. The shaft advancement between the elapsed sampling interval is then used to update the computer 40 estimate of the rotational rate of the subject shaft.

The computer 40 determination of the new shaft position (angle) and rotational rate for the $i$-th shaft are supplied to a corresponding shaft position output processor $50_i$, as via a common output bus. Examining the output processor 50, shown in detail, illustrative of all others 50, an identity decoder 54 recognizes that the computer output message is for the processor $50_1$ and therefore gates that computer data to the processor $50_1$ elements, as is conventional per se for common bus operation. Alternatively, each processor $50_i$ may be connected to a different output signalling port of the CPU 40.

Each processor $50_i$, e.g., the unit 50, includes a rate multiplier 58 cycled by an oscillator 56, and which in turn drives a counter 68, advantageously via a divider 60 (which may be the least significant digit stage(s) of the counter 68). The shaft rotational rate is supplied to the binary control ports of the rate multiplier 58 via a register (latch) 55, and the computer 40 determined current shaft angle is used to preset the counter 68. A rate multiplier 58 is a per se well known electrical circuit which receives an input pulse wave (from oscillator 56), and which supplies an output asynchronous wave of a frequency (no greater than the input frequency) proportional to the product of the input frequency, and a digital control word (from register 55), which control word thus has the attribute of controlling the output frequency, or "rate". The divider 60 is advantageously utilized to render more nearly synchronous the output of the rate multiplier 58.

From a functional descriptive standpoint, the shaft angle determination supplied to the output processor $50_1$ by the CPU 40 presets counter 68 to the computed shaft angle. The CPU 40 then also loads the register 55 with the shaft rate. The rate direction stored in the register 55 signals the counter 68 to count up (increment) or down (decrement), and the stored rate amplitude controls the rate multiplier 58. Thus, at the end of a sampling operation for the $i$-th shaft, the associated counter $68_i$ is preset to begin at the computed, then-obtaining shaft angle. Thereafter, the oscillator 56, rate multiplier $58_i$ and divider $60_i$ increase or decrease the shaft position at the last determined shaft rate and direction. Thus, the counter output $68_i$ "tracks" the rotational angle of the $i$-th shaft between sampling operations for the shaft. The composite FIG. 1 arrangement therefore provides progressive shaft position data — and not discrete data which has quantum discontinuities after every sampling interval.

The above-described functioning of the CPU 40 for each shaft polling operation is shown in flow chart form in FIG. 2. It will be understood that FIG. 2 depicts only one mode of data processing, and one form of schematic stored program coding therefor.

The CPU 40 first enters (functional block 80) the sine (SIN), cosine (COS) and reference wave polarity (POL) shaft angle characterizing signals developed by the sample and hold circuits 27, 29, 30, polarity detector 32, and multiplexer 34-data converter 35 into the indicated storage locations. The shaft angle (ANG) reported by the data may then be computed as by an arc tangent subroutine (functional block 82)

$$ANG = ARCTAN (|SIN|/|COS|), \quad (1)$$

adjusted for quadrant (as by 2-by-3 table look-up for the algebraic signs of SIN, COS, POL), and stored in the address ANG.

The computer 40 next estimates the new shaft angle (ESNA) from the elapsed time since the previous sampling period (stored in ELTM), and the previously obtaining shaft rate (RTE) and angular position (OLDANG) after the last sampling operation, as by:

$$ESNA = OLDANG + RTE \cdot ELTM \quad (2)$$

(functional block 84). The error (ERROR) between the position where the SCOTT "T" reported the shaft (ANG) and where the computer 40 predicted it would be, is determined:

$$ERROR = ANG - ESNA \quad (3)$$

and the computer 40's best estimate of the present shaft angle (NPOS) is computed as by:

$$NPOS = ESNA + CONST1 \cdot ERROR \quad (4)$$

where CONST1 is a first Weiner filter constant. Again the reason NPOS rather than ANG is used for the present shaft position is because ANG — a single reading — may be seriously in error, as an electrical noise signal or the like. It will be appreciated that Weiner filter functioning such as that of expressions (2) — (4) add inertia to the computation of shaft angle, and prevents gross output angle error due to an isolated bad data signal.

Next, the variable OLDANG is updated, $$OLDANG = NPOS \quad (5)$$

for the next sampling cycle, and the current shaft rate (RTE) is updated as on a Weiner filter basis also, $$RTE = RTE + CONST2 \cdot ERROR/ELTM \quad (6).$$

The derived shaft position (NPOS) and rate (RTE) are then outputed to preset the appropriate counter 68 and rate multiplier controlling register 55, respectively, for purposes above discussed.

The FIG. 1 arrangement has thus been shown by the above to employ both common and per-shaft equipment to provide running output indicia of the rotational position of an arbitrarily large number of monitored shafts.

The above described arrangement is merely illustrative of the principles of the present invention. Numerous modifications and adaptations thereof will be readily apparent to those skilled in the art without departing from the spirit and scope of the present invention. For example, the oscillator 56-rate multiplier 58 combinations may be replaced by other digitally controllable variable frequency oscillators well knonw to those skilled in the art. Similarly, the oscillator, rate multiplier and counter 56, 58 and 60 for each output processor $50_1$ may comprise counter or other accumulator incremented at a fixed rate, but with an increment (decrement) having an amplitude proportional to the shift rate output of the computer 40. Indeed, such a counter or accumulator may itself comprise a storage cell or register in the computer 40.

What is claimed is:

1. In combination in apparatus for characterizing the angular position of a rotating shaft, a programmable variable frequency oscillator, means for signaling the rate of rotation of the shaft and for supplying a digital word signaling such rate to said variable frequency oscillator for controlling the output oscillation frequency thereof, and a counter connected to the output of said variable frequency oscillator, further comprising shaft monitoring means for signaling the rotational position of the shaft, and means responsive to said shaft rotational position signaling means for selectively presetting said counter.

2. A combination as in claim 1 wherein said shaft rotational position and rate signalling means include a synchro, a Scott "T", and a digital processor.

3. In combination in apparatus for characterizing the angular position of a rotating shaft, a programmable variable frequency oscillator, means for signaling the rate of rotation of the shaft and for supplying a digital word signalling such rate to said variable frequency oscillator thereof, and a counter connected to the output of said variable frequency oscillator, wherein said variable frequency oscillator includes a rate multiplier controlled by said shaft rotational rate signalling means, and a pulse source connected as an input to said rate multiplier.

4. A combination as in claim 3 further comprising a divider connected intermediate said rate multiplier and said counter.

5. A combination as in claim 4 further comprising a shaft rate preserving register connected to said rate multiplier.

6. In combination in apparatus for providing digital measures of the orientation of a plurality of rotatable shafts, plural shaft position output processor means each for reporting the current position of an associated shaft, said shaft position outputting processor means each including a programable variable frequency oscillator and a counter connected to the output of said variable frequency oscillator, plural shaft position monitoring means, sampling shaft movement determining means sequentially connected to said plural shaft position monitoring means for controlling the variable frequency oscillator associated with each shaft to perform at a frequency proportional to the rotational rate of the shaft.

7. A combination as in claim 6 wherein said output processor means further comprise counter preset means, and wherein said sampling shaft movement means further comprises means for determining shaft position, said counter presetting means of each output processing means presetting the corresponding counter to the position determined by said shaft position determining means.

8. A combination as in claim 7 wherein said shaft position determining means includes Weiner filter means for determining said shaft position dependent upon the shaft position reported by said shaft position monitoring means and also upon the projected shaft position given by the previously determined shaft position and rotational rate.

9. A combination as in claim 7 wherein said shaft position determining means includes Weiner filter means for progressively updating said shaft rotational rate programmable oscillator rate proportional output frequency.

10. In combination in apparatus for providing digital measures of the orientation of a plurality of rotatable shafts, plural shaft position output processor means each for reporting the current position of an associated shaft, said shaft position outputting processor means each including a programmable variable frequency oscillator and a counter connected to the output of said variable frequency oscillator, plural shaft position monitoring means, sampling shaft movement determining means sequentially connected to said plural shaft position monitoring means for controlling the variable frequency oscillator associated with each shaft to perform at a frequency proportional to the rotational rate of that shaft, wherein said programmable variable frequency oscillator in each of said output processing means includes a rate multiplier and pulse source connected to said rate multiplier.

11. In combination in apparatus for providing digital measures of the orientation of a plurality of rotatable shafts, plural shaft position outputting means each for reporting the current position on an associated shaft, said shaft position outputting means each including bidirectional accumulator means, and programmable variable incrementing means connected to the input of said accumulating means for cycling said accumulating means at a variable rate, plural shaft position monitoring means, sampling shaft movement determining means sequentially connected to said plural shaft position monitoring means for controlling the variable incrementing means associated with each shaft to perform at an incremental value dependent upon the rotational rate of that shaft.

12. A combination as in claim 11 wherein said output processor means further comprises accumulator preset means, and wherein said sampling shaft movement means further comprises means for determining shaft position, said accumulator presetting means of each outputting means presetting the corresponding accumulator means to the position determined by said shaft position determining means.

* * * * *

UNITED STATES PATENT OFFICE
CERTIFICATE OF CORRECTION

Patent No. 4,062,005            Dated December 6, 1977

Inventor(s)   Freed, Gerald Lewis; and Lerner, David S.

It is certified that error appears in the above-identified patent and that said Letters Patent are hereby corrected as shown below:

Claim 6, line 16: change "the" second occurrence to --that--.

Signed and Sealed this

Fourteenth Day of March 1978

[SEAL]

Attest:

RUTH C. MASON  
Attesting Officer

LUTRELLE F. PARKER  
Acting Commissioner of Patents and Trademarks